US006667543B1

United States Patent
Chow et al.

(10) Patent No.: US 6,667,543 B1
(45) Date of Patent: Dec. 23, 2003

(54) OPTICAL SENSOR PACKAGE

(75) Inventors: Wai Wong Chow, Sheung Shui (HK); Man Hon Cheng, N.T. (HK); Wai Keung Ho, Tsz Wan Shan (HK)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/282,537

(22) Filed: Oct. 29, 2002

(51) Int. Cl.[7] ............................................. H01L 23/495
(52) U.S. Cl. ....................... 257/676; 257/434
(58) Field of Search ............................. 257/666, 704, 257/676, 433, 434

(56) References Cited

U.S. PATENT DOCUMENTS

| | | |
|---|---|---|
| 6,121,675 A | 9/2000 | Fukamura et al. |
| 6,266,197 B1 | 7/2001 | Glenn et al. |
| 6,342,406 B1 | 1/2002 | Glenn et al. |
| 6,384,472 B1 | 5/2002 | Huang |
| 6,492,699 B1 * | 12/2002 | Glenn et al. ............... 257/433 |

FOREIGN PATENT DOCUMENTS

WO    WO 01/15237 A1    3/2001

OTHER PUBLICATIONS

Amkor Technology, Inc. Data Sheet VisionPak™ LCC. [Online] Available http://amkor.com, Apr. 2001.

Shellcase. Wafer Level Chip Size Packaging. Online Available http://www.shellcase.com/pages/products.asp, Sep. 20, 2002.

* cited by examiner

*Primary Examiner*—Roy Potter
(74) *Attorney, Agent, or Firm*—Charles Bergere

(57) ABSTRACT

An image sensor device includes a QFN type leadframe having a central die attach flag and an outer bonding pad area having a plurality of bonding pads. A sensor IC is attached to the flag. The IC has a first surface with an active area and a peripheral bonding pad area that includes bonding pads. Wires are wirebonded to respective ones of the IC bonding pads and corresponding ones of the leadframe bonding pads, thereby electrically connecting the IC and the leadframe. Stud bumps are formed on the first surface of the IC and a transparent cover is disposed over the IC active area and resting on the stud bumps. The cover allows light to pass therethrough onto the IC active area. A mold compound is formed over the leadframe, wirebonds and a peripheral portion of the cover.

13 Claims, 3 Drawing Sheets

OPTICAL SENSOR PACKAGE

BACKGROUND OF THE INVENTION

The present invention relates to image and optical sensors and, more particularly, to a method of packaging an optical sensor and the resulting packaged sensor product.

There has been a constant demand for smaller and smarter industrial and consumer electronic products such as digital cameras, camcorders, audio players, etc. Such miniaturization and increased functionality has benefited from advances in the design and manufacturing of semiconductor circuits and wafers. There has also been a marked increase in the use of optical and image sensors in electronic products. Such sensor devices are packaged in a variety of ways. For example, an optical sensor in a ceramic leadless chip carrier has good optical quality, but large package form factor. A wafer level package, whole having a lesser form factor and good optical quality, is very expensive. Image sensors are also available as a molded quad flat pack (QFP). While the QFP has a moderate cost, it has low optical quality and a large package form factor.

It would be advantageous to provide a packaged image sensor with a low package form factor, moderate cost, and high optical quality.

BRIEF DESCRIPTION OF THE DRAWINGS

The foregoing summary, as well as the following detailed description of the present invention, will be better understood when read in conjunction with the appended drawings. For the purpose of illustrating the invention, there is shown in the drawings embodiments that are presently preferred. It should be understood, however, that the invention is not limited to the precise arrangement and instrumentalities shown. In the drawings.

DETAILED DESCRIPTION OF PREFERRED EMBODIMENTS

Figure 1:
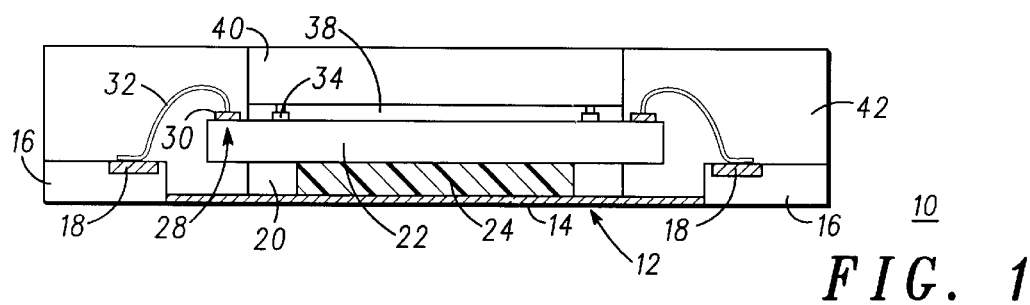
FIG. 1 is an enlarged, cross-sectional view of an optical sensor device in accordance with the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

The present invention provides an image sensor device with low cost and high optical quality in a near chip scale package based on standard high density array format, quad flat no-lead (QFN) assembly infrastructure. A tight tolerance in assembly height and unique mechanical structure design provides close dimension matching with mold cavity height. The packaged sensor device uses stud bumps as precise height standoff objects to assemble a window over an active area of a sensor. A vacuum hole located beneath the device during assembly is used to form a bump that provides the dual functions of height compensation in molding and avoiding clamping damage due to height mismatch. The window is maintained in contact with the mold cavity surface, which minimizes resin bleeding and facilitates post-mold cleaning.

More particularly, in one embodiment, the present invention provides an image sensor device including a QFN type leadframe having a central die attach flag and an outer bonding pad area having a plurality of bonding pads. A sensor integrated circuit (IC) is attached to the flag. The IC has a first surface with an active area and a peripheral bonding pad area including bonding pads. A plurality of wires are wirebonded to respective ones of the IC bonding pads and corresponding ones of the leadframe bonding pads, thereby electrically connecting the IC and the leadframe. A plurality of stud bumps are disposed on the first surface of the IC and a transparent cover is disposed over the IC active area and rests on the stud bumps. The cover allows light to pass through onto the IC active area. A mold compound is formed over the leadframe, wirebonds and a peripheral portion of the cover.

In another embodiment, the present invention provides an image sensor device including a QFN type leadframe having a central die attach flag and an outer bonding pad area having a plurality of bonding pads. The flag has a perimeter ring that forms a bond line having a height that is about the same as a thickness of the leadframe. A sensor integrated circuit (IC) is attached to the flag with a low modulus adhesive disposed within the flag perimeter ring. The IC has a first surface with an active area and a peripheral bonding pad area. The peripheral bonding pad area includes bonding pads. A plurality of gold wires are wirebonded to respective ones of the IC bonding pads and corresponding ones of the leadframe bonding pads, thereby electrically connecting the IC and the leadframe. A plurality of gold stud bumps are formed on the active area of the first surface of the IC. A clear compound is disposed over the IC active area. A transparent glass cover is disposed over the clear compound on the IC active area and rests on the stud bumps. Light may pass through the cover and the clear compound onto the IC active area. A mold compound is formed over the leadframe, wirebonds and a peripheral portion of the cover. The device has a height of less than about 40 mils.

In yet another embodiment, the present invention is an image sensor device including a QFN type leadframe having a central die attach flag and an outer bonding pad area having a plurality of bonding pads. A sensor IC is attached to the flag. The IC has a first surface with an active area, a non-active area and a peripheral bonding pad area including bonding pads. A plurality of wires are wirebonded to respective ones of the IC bonding pads and corresponding ones of the leadframe bonding pads, thereby electrically connecting the IC and the leadframe. A clear compound is disposed over the IC active area and a transparent glass cover is disposed over the clear compound on the IC active area. Light is able to pass through the cover and the clear compound onto the IC active area. A mold compound is formed over the leadframe, wirebonds, IC wirebonds, IC non-active area and a peripheral portion of the cover.

In yet another embodiment, the present invention provides a method of making an image sensor device, including the steps of:

provide a QFN type leadframe having a central die attach flag and an outer bonding pad area having a plurality of bonding pads, wherein the flag has a perimeter ring that forms a bond line having a height that is about the same as a thickness of the leadframe;

disposing a die attach material on the flag and within the perimeter ring;

attaching a sensor integrated circuit (IC) to the flag with the die attach material, the IC having a first surface with an active area and a peripheral bonding pad area, the peripheral bonding pad area including bonding pads;

electrically connecting respective ones of the IC bonding pads and corresponding ones of the leadframe bonding pads with a plurality of wires via wirebonding;

forming a plurality of stud bumps on the first surface of the IC;

placing a transparent cover over the IC active area such that the cover rests on the stud bumps, wherein light may pass through the cover and onto the IC active area; and forming a mold compound over the leadframe, wirebonds and a peripheral portion of the cover.

In a further embodiment, the present invention is a method of making an image sensor device, including the steps of:

providing a QFN type leadframe having a central die attach flag and an outer bonding pad area having a plurality of bonding pads, wherein the flag has a perimeter ring that forms a bond line having a height that is about the same as a thickness of the leadframe;

disposing a die attach material on the flag and within the perimeter ring;

attaching a sensor integrated circuit (IC) to the flag with the die attach material, the IC having a first surface with an active area and a peripheral bonding pad area, the peripheral bonding pad area including bonding pads;

placing the leadframe on a stage curing heat block having a vacuum hole at a central position under the flag;

electrically connecting respective ones of the IC bonding pads and corresponding ones of the leadframe bonding pads with a plurality of wires via wirebonding;

dispensing a clear compound over the IC active area;

placing a transparent cover over the clear compound on the IC active area, wherein light may pass through the cover and the compound and onto the IC active area; and forming a mold compound over the leadframe, wirebonds and a peripheral portion of the cover.

Figure 2:
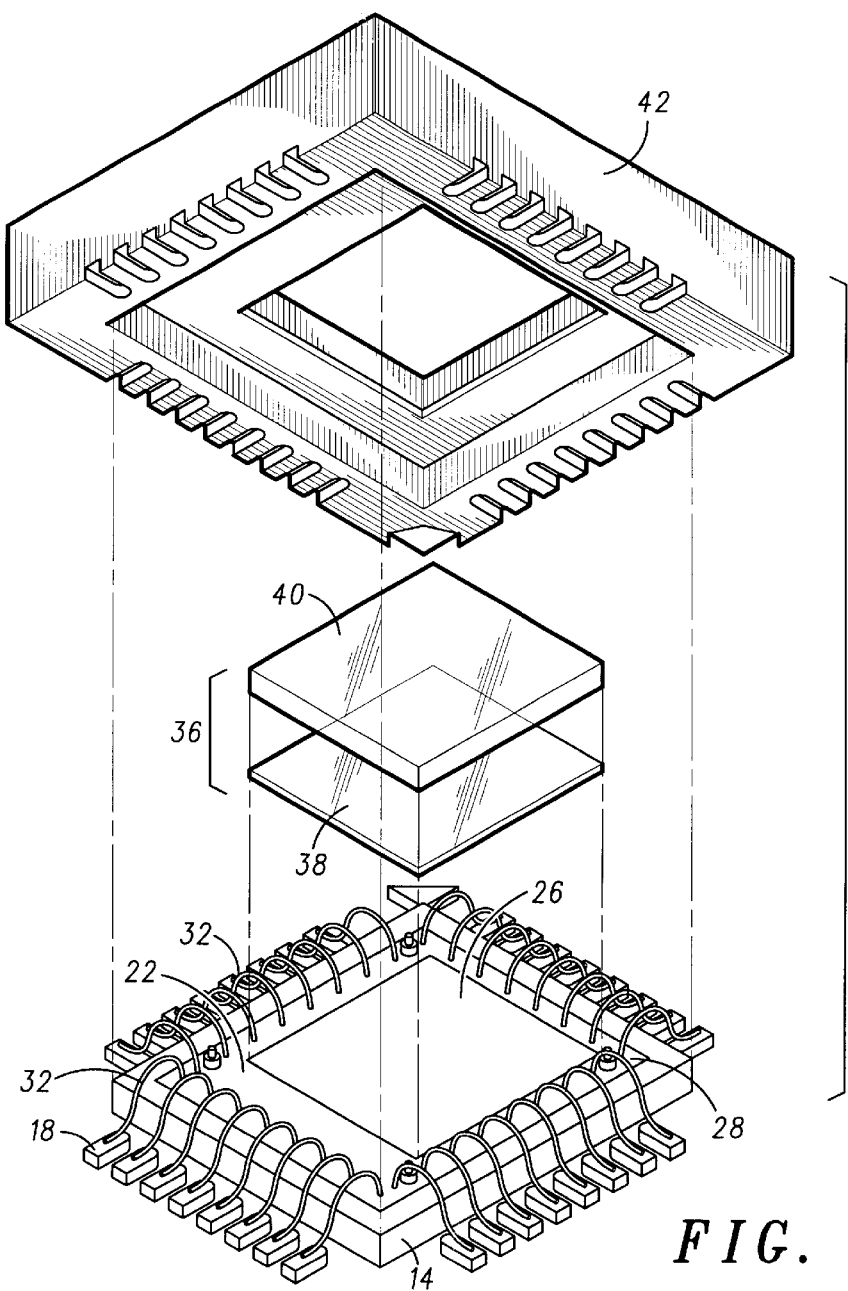
FIG. 2 is an enlarged, exploded perspective view of an optical sensor device in accordance with the present invention.

Referring to FIGS. 1 and 2, FIG. 1 is an enlarged side view of an image sensor device 10 in accordance with the present invention and FIG. 2 is an enlarged exploded view of the sensor device 10. The sensor device 10 includes a metal QFN (quad flat no-lead) leadframe 12. The QFN leadframe is preferred because of its small form factor, low profile, and low assembly cost. The leadframe 12 has a central die attach flag 14 and an outer bonding pad area 16 having a plurality of bonding pads 18. The flag also has a perimeter ring 20 that forms a bond line. The perimeter ring 20 has a height that is about the same as a thickness of the leadframe 12.

A sensor integrated circuit (IC) 22 is attached to the flag 14 of the leadframe 12, preferably with a low stress, low modulus die attach adhesive 24 disposed within the flag perimeter ring 20. The IC 22 has a first surface with an active area 26 (FIG. 2) and a peripheral bonding pad area 28. The peripheral bonding pad area 28 includes bonding pads 30. The IC 22 is preferably a CMOS sensor device of a type that is known by those of skill in the art and readily commercially available. The IC 22 has a thickness or height of about 15 mils. The IC 22, in addition to including a light receiving area (active area 26) includes circuitry and logic, such as an A/D converter and a DSP or logic area for performing arithmetic type operations. A plurality of wires 32 are wirebonded to respective ones of the IC bonding pads 30 and corresponding ones of the leadframe bonding pads 18, thereby electrically connecting the IC 22 and the leadframe 12. The wires 32 may be formed of any electrically conductive metal or combination of metals, such as are known by those of skill in the art. Suitable bond wires typically comprise a conductive metal such as copper or gold and may be either fine wires (<50 um in diameter) or heavy wires (>50 um in diameter). In the presently preferred embodiment, the wires 32 are fine wires formed of gold.

The term 'wirebonding' is generally accepted to mean the interconnection, via wire, of chips and substrates. The most frequently used methods of joining the wires to the pads are via either thermosonic or ultrasonic bonding. Ultrasonic wirebonding uses a combination of vibration and force to rub the interface between the wire and the bond pad, causing a localized temperature rise that promotes the diffusion of molecules across the boundary. Thermosonic bonding, in addition to vibration, uses heat, which further encourages the migration of materials.

A plurality of stud bumps 34 are formed on the first surface of the IC 22. In the preferred embodiment, the stud bumps 34 are formed of the same material as the wires 32, e.g., gold. The stud bumps 34 have a height of about 3 mils and are positioned proximate to the IC active area 26. The stud bumps 34 are formed on the IC 22 using the capillary of the wirebonder that performs the wirebonding. The stud bumps 34 are formed or disposed on the IC 22 in the same manner that the wirebonding is performed. That is, the process for forming the stud bumps 34 is very similar to the normal thermo-sonic gold ball bonding process, except that there are no loop formation and second bond formation steps. More particularly, a free air ball is formed by electric flame off and captured in the capillary and then a first bond is formed on the surface of the IC 22. After forming the first bond, the tail length is released and tail separation (pull-off from the first bond) is performed. This process is repeated for each stud bump.

A transparent cover 36 (FIG. 2) is disposed over the IC active area 26 and rests on the stud bumps 34. In the presently preferred embodiment, the cover 36 includes a clear compound 38 disposed over the IC active area 26 and a window 40 overlying the clear compound 38 and resting on the stud bumps 34. Thus, the stud bumps 34 act as a stand-off of the window 40. The cover 36 allows light to pass therethrough onto the IC active area 26. The window 40 preferably is a non-reflective optical grade glass and has a thickness of about 15 to 16 mils. The window 40 may be coated with various materials to filter the light, as desired. The clear compound 38 may be a clear epoxy in liquid form, before curing. The clear compound 38 can be deposited onto the sensor active area 26 by any dispensing system. Then, the window 40 is placed on top of the clear compound 38 (and the stud bumps 34). A heat curing process is then performed to cure and harden the epoxy, which then bonds the window 40 to the IC active area 26.

To complete the device 10, a mold compound 42 is formed over the leadframe 12, wirebonds and a peripheral portion of the cover 36. The stud bumps 34 act as a precise height stand-off and maintain the window 40 in a position between the IC 22 and the mold compound 42. The image sensor device 10 has an overall height of about 40 mils.

Figure 3:
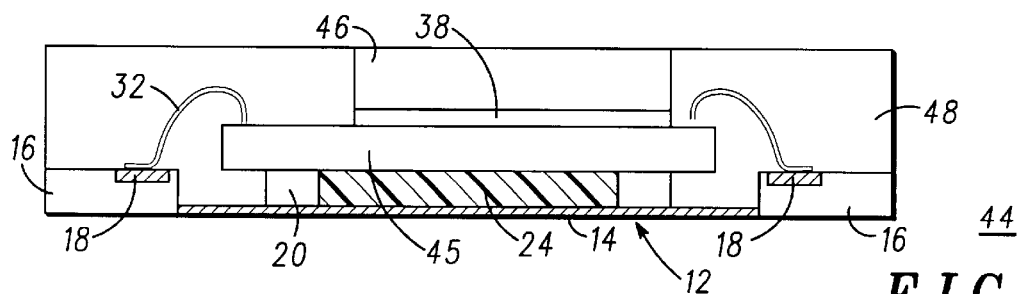
FIG. 3 is an enlarged, cross-sectional view of an alternative embodiment of an optical sensor device in accordance with the present invention.

Referring now to FIG. 3, an enlarged side view of an image sensor device 44 in accordance with an alternate embodiment of the present invention is shown. The sensor device 44 is similar to the sensor device 10 (FIG. 1) except the sensor device 44 has a sensor IC 45 that has a large non-active area. That is, the sensor IC 45 has a top surface with an active, light receiving area, a non-active area that does not include photo cells, and a peripheral bonding pad area. The clear compound 38 is disposed over the IC active area and a cover 46 that is sized to cover only the active area is adhered to the active area via the clear compound 38. A mold compound 48 is formed over the leadframe 12, wires 32, the non-active area of the IC 45 and a peripheral portion of the cover 46. Since the mold compound 48 covers the non-active area of the IC 45, only the active area of the IC 45 is exposed to light. Thus, if the IC 45 includes memory cells that are sensitive to light, such cells are shielded from light by the mold compound 48.

It should also be noted that the sensor device 44 does not include stud bumps, although it could include stud bumps if desired. It should be understood by those of skill in the art that the first embodiment (device 10) could also be formed without the stud bumps 34.

Figure 4A:
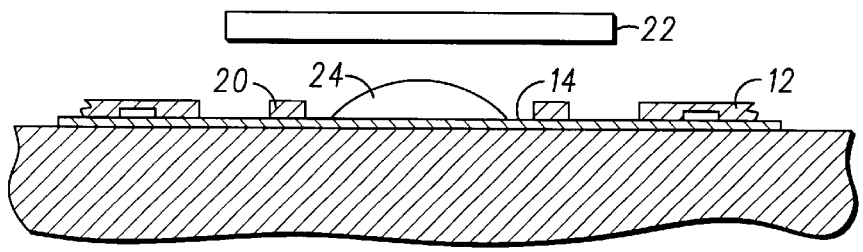
FIGS. 4A–4E are enlarged, cross-sectional views illustrating the steps of forming the sensor device of FIGS. 1 and 2.

Referring now to FIGS. 4A–4E, enlarged, cross-sectional views illustrating the steps of forming the sensor device 10 of FIGS. 1 and 2 are shown. FIG. 4A shows the metal QFN leadframe 12 having a central die attach flag 14 and an outer bonding pad area having a plurality of bonding pads. The flag 14 has a perimeter ring 20 that forms a bond line having a height that is about the same as a thickness of the leadframe 12. A die attach material 24 is disposed on the flag 14 and within the perimeter ring 20. That is, the flag 14 has a central opening for receiving a low modulus attach paste or die attach adhesive. The die attach material 24 is of a known type and dispensed onto the flag 14 in a conventional manner. The sensor integrated circuit (IC) 22 is attached to the flag 14 with the die attach material 24. The leadframe 12 may be taped with mold masking tape. As previously discussed with reference to FIGS. 1 and 2, the IC 22 has a first surface with an active area and a peripheral bonding pad area. The peripheral bonding pad area includes bonding pads.

Figure 4B:
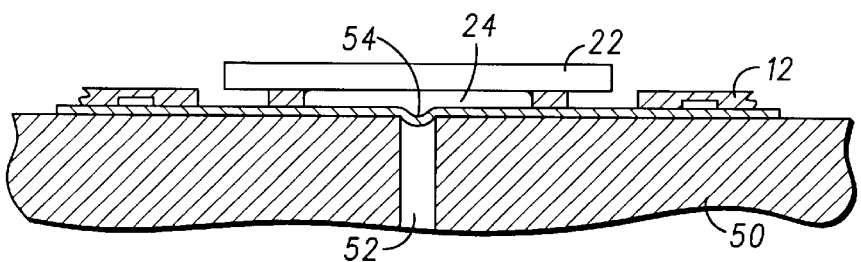

After the IC 22 is attached to the flag 14 of the leadframe 12, the assembly is transported to a stage curing heat block 50 that has a vacuum hole 52. The assembly is located on the heat block 50 such that the flag 14 is over the hole 52, as shown in FIG. 4B. A vacuum force is applied that causes the tape and die attach material 24 to collapse into the vacuum hole. The collapsing action is controlled by the amount of vacuum force applied and the size of the hole 52. Substantially simultaneously, the die attach material 24 is cured. After completing the curing cycle, a bump 54 that protrudes from the die attach layer is formed. The bump 54 is generally soft and compliant. As discussed further below, the bump 54 is used for height compensation during a molding step.

Figure 4C:
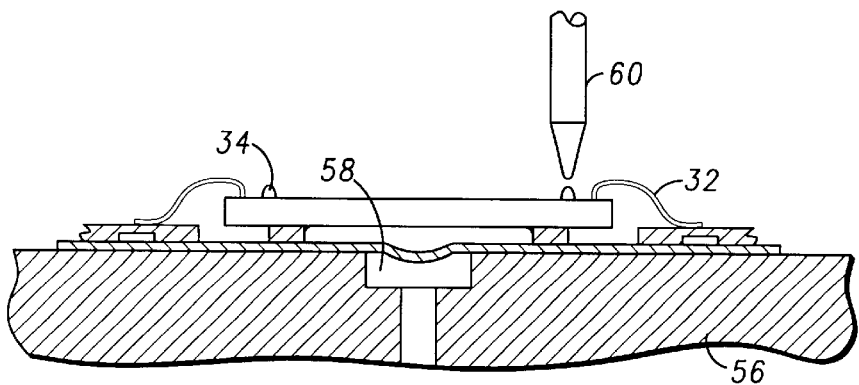

Referring now to FIG. 4C, the assembly is moved to a conventional wirebonder. The wirebonder includes a heatblock 56 having a hole 58 that is larger than the size of the bump 54, which allows the assembly to lie stably on the heat block 56. Wirebonding is performed to electrically connecting respective ones of the IC bonding pads and corresponding ones of the leadframe bonding pads with a plurality of wires, in a conventional manner. Also, the stud bumps 34 are formed on the first surface of the IC 22 with the wirebonder capillary 60. As previously discussed, the stud bumps 34 are formed of the same material as the wires 32, i.e., gold. Further, no modification of the capillary 60 is required to form the stud bumps 34.

Figure 4D:
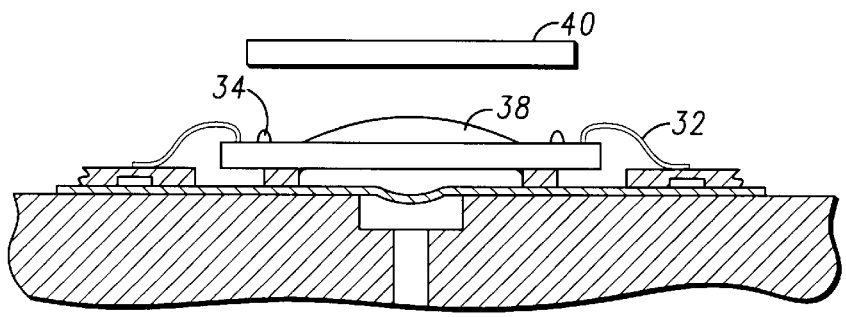

Referring now to FIG. 4D, a clear compound or gel 38 is dispensed onto the active area 26 of the sensor IC 22. The bondline thickness of the clear compound 38 is determined by the height of the stud bumps 34. According to the present invention, the height of the stud bumps 34 is about 3 mils. Then, a window 40, preferably glass is placed over the IC active area 26 such that the window 40 rests on the stud bumps 34. The clear compound 38 affixes the window 40 to the IC active area 26 except that the window 40 is spaced from the IC 22 by the stud bumps 34. The total assembly thickness is controlled to a very tight tolerance. For example, a typical height variation for the leadframe 12, IC 22, stud bump 34 and window 40 is about +/−1.5 mils. The window 40 and clear compound 38 allow light to pass therethrough and onto the IC active area 26.

Figure 4E:
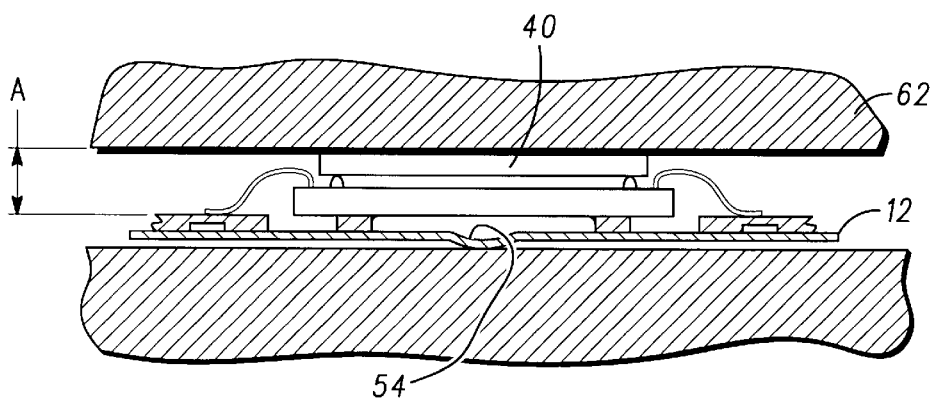

Finally, as shown in FIG. 4E, a top mold compound (compound 42 in FIG. 1) is formed over the leadframe 12, wirebonds and a peripheral portion of the cover 40. The mold cavity depth A is equal to the thickness of the IC 22 plus the stud bumps 34 plus the window 40. The height of the bump 54 is equal to the tolerance range of the sum of the IC 22, the stud bumps 34, and the window 40, which is about 3 mils. After forming the mold compound over the leadframe 12, wirebonds and the peripheral portion of the window 40, the bump 54 is collapsed to cause a force for maintaining the window 40 in contact with the mold cavity 62. That is, the glass window 40 is maintained in contact with the top mold cavity 62 by a small force generated by collapsing the bump 54 while the assembly is in the mold closure. Because the window 40 is held against the mold cavity 62, the amount of resin bleeding is limited. Any slight resin bleeding onto the glass surface can be removed by a subsequent water jet cleaning. Further, the low touching force against the glass window 40 also avoids potential surface scratching, even without the use of a protective tape. If multiple devices are formed at the same time, they are singulated to form the device 10 shown in FIG. 1. The finished device has a height of less than about 40 mils.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

What is claimed is:

1. An image sensor device, comprising:
   a QFN type leadframe having a central die attach flag and an outer bonding pad area having a plurality of bonding pads;
   a sensor integrated circuit (IC) attached to the flag, the IC having a first surface with an active area and a peripheral bonding pad area, the peripheral bonding pad area including bonding pads;
   a plurality of wires wirebonded to respective ones of the IC bonding pads and corresponding ones of the leadframe bonding pads, thereby electrically connecting the IC and the leadframe;

a plurality of metal stud bumps on the first surface of the IC;

a transparent cover disposed over the IC active area and resting on the stud bumps, the cover allowing light to pass therethrough onto the IC active area; and a mold compound formed over the leadframe, wirebonds and a peripheral portion of the cover.

2. The image sensor device of claim 1, wherein the flag has a perimeter ring that forms a bond line having a height that is about the same as a thickness of the leadframe.

3. The image sensor device of claim 2, wherein the IC is attached to the flag with a low modulus adhesive disposed within the flag perimeter ring.

4. The image sensor device of claim 1, wherein the stud bumps are formed of gold.

5. The image sensor device of claim 4, wherein the stud bumps have a height of about 3 mils.

6. The image sensor device of claim 4, wherein the wires are made of gold.

7. The image sensor device of claim 1, further comprising a clear compound disposed between the IC active area and the cover.

8. The image sensor device of claim 7, wherein the cover is made of glass.

9. The image sensor device of claim 1, wherein the stud bumps are formed on the IC active area.

10. The image sensor device of claim 1, wherein the device has a height of about 40 mils.

11. An image sensor device, comprising:

a QFN type leadframe having a central die attach flag and an outer bonding pad area having a plurality of bonding pads, wherein the flag has a perimeter ring that forms a bond line having a height that is about the same as a thickness of the leadframe;

a sensor integrated circuit (IC) attached to the flag with a low modulus adhesive disposed within the flag perimeter ring, the IC having a first surface with an active area and a peripheral bonding pad area, the peripheral bonding pad area including bonding pads;

a plurality of gold wires wirebonded to respective ones of the IC bonding pads and corresponding ones of the leadframe bonding pads, thereby electrically connecting the IC and the leadframe;

a plurality of gold stud bumps formed on the active area of the first surface of the IC;

a clear compound disposed over the IC active area;

a transparent glass cover disposed over the clear compound on the IC active area and resting on the stud bumps, wherein light may pass through the cover and the clear compound onto the IC active area; and a mold compound formed over the leadframe, wirebonds and a peripheral portion of the cover, wherein the device has a height of less than about 40 mils.

12. An image sensor device, comprising:

a QFN type leadframe having a central die attach flag and an outer bonding pad area having a plurality of bonding pads;

a sensor integrated circuit (IC) attached to the flag, the IC having a first surface with an active area, a non-active area and a peripheral bonding pad area, the peripheral bonding pad area including bonding pads;

a plurality of wires wirebonded to respective ones of the IC bonding pads and corresponding ones of the leadframe bonding pads, thereby electrically connecting the IC and the leadframe;

a plurality of metal stud bumps formed on the first surface of the IC;

a clear compound disposed over the IC active area;

a transparent glass cover disposed over the clear compound on the IC active area and spaced from the IC active area by the stud bumps, wherein light may pass through the cover and the clear compound onto the IC active area; and a mold compound formed over the leadframe, wirebonds, IC wirebonds, IC non-active area and a peripheral portion of the cover.

13. An image sensor device, comprising:

a leadframe having a central die attach flag and an outer bonding pad area having a plurality of bonding pads;

a sensor integrated circuit (IC) attached to the flag, the IC having a first surface with an active area and a peripheral bonding pad area, the peripheral bonding pad area including bonding pads;

a plurality of wires wirebonded to respective ones of the IC bonding pads and corresponding ones of the leadframe bonding pads, thereby electrically connecting the IC and the leadframe;

a plurality of stud bumps formed on the first surface of the IC with a wirebonder;

a transparent cover disposed over the IC active area and resting on the stud bumps, the cover allowing light to pass therethrough onto the IC active area; and a mold compound formed over the leadframe, wirebonds and a peripheral portion of the cover.

* * * * *